United States Patent
Tatsuki et al.

Patent Number: 5,716,907
Date of Patent: Feb. 10, 1998

[54] ROCK-SALT/INFINITE LAYER CHLORINE-CONTAINING OXIDE SUPERCONDUCTOR AND MANUFACTURING METHOD OF THE SAME

[75] Inventors: Tadashi Tatsuki, Tokyo; Seiji Adachi, Fujimi; Makoto Itoh, Kawanishi; Toshiyuki Tamura, Sagamihara; Changqin Jin, Beijing; Xiao-Jing Wu, Funabashi; Hisao Yamauchi, Yokohama, all of Japan

[73] Assignees: International Superconductivity Technology Center, Tokyo, Japan; The Furukawa Electric Co., Ltd., Sendai, Japan; Tohoku Electric Power, Miyagi, Japan

[21] Appl. No.: 618,827

[22] Filed: Mar. 20, 1996

[30] Foreign Application Priority Data

Mar. 24, 1995 [JP] Japan .................. 7-065806

[51] Int. Cl.$^6$ .................. H01B 12/00; C04B 35/01; C04B 35/645
[52] U.S. Cl. .................. 505/123; 505/125; 505/776; 505/779; 505/482; 252/521
[58] Field of Search .................. 252/521; 505/123, 505/125, 776, 779, 482

[56] References Cited

U.S. PATENT DOCUMENTS 5,446,017  8/1995  Sakurai et al. .................. 505/125

FOREIGN PATENT DOCUMENTS 590929  4/1994  European Pat. Off. .

OTHER PUBLICATIONS

M. Azuma et al; "Superconductivity at 110 K in the infinite-layer compound . . . "; Apr. 30, 1992; pp. 775–776; Nature; vol. 356.

Adachi et al; "New superconducting cuprates in the Sr–Ca–Cu–O system"; 1993; pp. 164–168; Physica C. No Month.

Hiroi et al; "Probable hole–doped superconductivity without apical oxygens in (Ca, NA . . . "; Sep. 8, 1994; pp. 139–141; Nature; vol. 371.

Database WPI, Week 9224, Derwent Publications Ltd. London, GB; AN 92–196925 XP002007550 & JP–A–04 130 015 (Hitachi Ltd.), May 1, 1995 –Abstract.

Nature, vol. 375, May 25, 1995, pp. 301–303, C.–Q–Jin et al XP002007548.

Physica C., vol. 255, No. 1&2, Dec. 1, 1995, pp. 61–64, T. Tatsuki et al. –XP002007549.

Adachi et al. "High–Pressure synthesis of superconducting Sr–Ca–Cu–O samples" Physica C, 208(1993) pp.226–230. (No Month Available).

*Primary Examiner*—Paul Lieberman
*Assistant Examiner*—Mark Kopec
*Attorney, Agent, or Firm*—Frishauf, Holtz, Goodman, Langer & Chick, P.C.

[57] ABSTRACT

The present invention is an oxide superconductor containing alkaline earth metal M (where M is at least one element of Ba, Sr, and Ca) and having a crystalline structure in which a portion based on two rock-salt structures including the alkaline earth metal M, oxygen, and chlorine, and a 2n–1 piece of infinite layer structure portion are alternately layered on each other, said 2n–1 piece of infinite layer structure portion having an atom layer including copper atoms and oxygen atoms in a ratio of 1 to 2 and of an atom layer including only M atoms layered on each other (where n is an integer of 1 or more and where copper atoms and oxygen atom are contained in a ratio of 1 to 2 if n is 1).

14 Claims, 2 Drawing Sheets

ROCK-SALT/INFINITE LAYER CHLORINE-CONTAINING OXIDE SUPERCONDUCTOR AND MANUFACTURING METHOD OF THE SAME

BACKGROUND OF THE INVENTION

1. Field of the Invention

The present invention relates to an oxide superconductor having a high superconductive transition point (Tc), and a manufacturing method thereof.

2. Description of the Related Art

An oxide superconductor has a distinguishable characteristic that this material has an electric resistance of zero, has complete diamagnetism, and exhibits Josephson effects, at the superconductive transition temperature (which will be referred to as Tc hereinafter) or lower. This characteristic is not attained by other materials. The oxide superconductor is therefore expected to be widely used in the fields of a power transmission line cable, a dynamo cable, a nuclear fusion plasma confinement material, a magnetic floating train material, a magnetic shield material, a high-speed processing computer, and the likes. Superconduction is a phenomenon which generally occurs at a low temperature, and a superconductive material must be cooled to cause a superconduction phenomenon; A superconductive material having a high Tc is easy to cool for causing a superconduction phenomenon, and is very useful in practice.

Since Bednorz and Muller found $(La_{1-x}Ba_x)_2CuO_4$ having a high Tc of about 30K in 1986, oxide superconductors of a relatively high temperature, such as $YBa_2Cu_3O_7$ (Tc=90K), Bi-Sr-Ca-Cu-O based oxide superconductor (Tc=110K), Tl-Ba-Ca-Cu-O based oxide superconductor (Tc=125K), and Hg-Ba-Ca-Cu-O based oxide superconductor (Tc=135K), have been reported. Currently, many studies have been made to the manufacturing methods, physical characteristics, and applications of these materials.

In recent days, studies and developments have eagerly been made to heavy metal such as Bi, Tl, and alkaline earth metal-copper-oxygen based oxide superconductors which does not contain Bi, Tl, heavy metal such as Hg, or rare earth metal such as Y. For example, in 1992, an oxide superconductor $(Sr_{1-x}Ca_x)_{1-y}CuO_{2+z}$ (Tc=110K) consisting of a $CuO_2$ layer and a (Sr/Ca) layer and having a crystalline structure called an infinite layer structure was reported (by M. Azuma et al., Nature 356(1992)775). In 1993, an Sr-Ca-Cu-O based oxide superconductor has been reported (by S. Adachi et al., Physica C 212(1993)164), which has an alternating layer structure (called a 02(n−1)n type) consisting of a rock-salt structure including a two-atom layer made of alkaline earth metal and oxygen, and an infinite layer structure. In addition, in very recent days, an oxide superconductor $(Ca, Na)_2CuO_2Cl_2$ (Tc=26K) was reported (by Z. Hiroi et al., Nature 371(1994)139), which has a composition in which chlorine and sodium are added to alkaline earth metal-copper-oxygen. These oxide superconductors cannot be composed under an ambient pressure, but are composed under a super high pressure.

Most of conventional oxide superconductors having a high Tc contain heavy metal Tl, Bi, and Hg, or elements of rare earth group which exist only in parochial places and require purification costs, and therefore, are difficult to put into practical use.

In addition, there is a problem oxide superconductor having an infinite layer structure and an alkaline earth metal-copper-oxygen based oxide superconductors such as 02(n−1)n type oxide superconductors which do not contain the elements described above are difficult to prepare as an excellent oxide superconductor which has a single phase and exhibits a strong Meissner effect. For example, no samples of a single phase have been obtained which attain a superconducting volume fraction of 20% or more at 5K.

An oxide superconductor having a composition in which chlorine and sodium are added to alkaline earth metal-copper-oxygen is difficult to prepare as an oxide superconductor which exhibits a strong Meissner effect (e.g., which attains only a Meissner effect of about 18% at most), and contains sodium which easily reacts with water, so that this superconductor is very unstable in the air. Further, since the composition contains sodium, a dry atmosphere must be ensured and maintained while the oxide superconductor is prepared. This leads to a problem that arrangement of the atmosphere is very difficult.

SUMMARY OF THE INVENTION

The present invention has been made in view of the above situation, and has an object of providing an oxide superconductor of single phase which does not include such an element that is difficult to treat, but is stable in the air and has an excellent superconductive characteristic, and a method of easily obtaining the oxide superconductor with high reproductivity.

According to the present invention, there is provided an oxide superconductor containing alkaline earth metal M (where M is at least one element of Ba, Sr, and Ca), coper, oxygen, and chlorine, and having a crystalline structure in which a portion based on two rock-salt structures including the alkaline earth metal M, oxygen, and chlorine, and a 2n−1 piece of infinite layer structure portion are alternately layered on each other, said 2n−1 piece of infinite layer structure portion having an atom layer including copper atoms and oxygen atoms in a ratio of 1 to 2 and of an atom layer including only M atoms layered on each other (where n is an integer of 1 or more and where copper atoms and oxygen atom are contained in a ratio of 1 to 2 if n is 1).

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Figure 1:
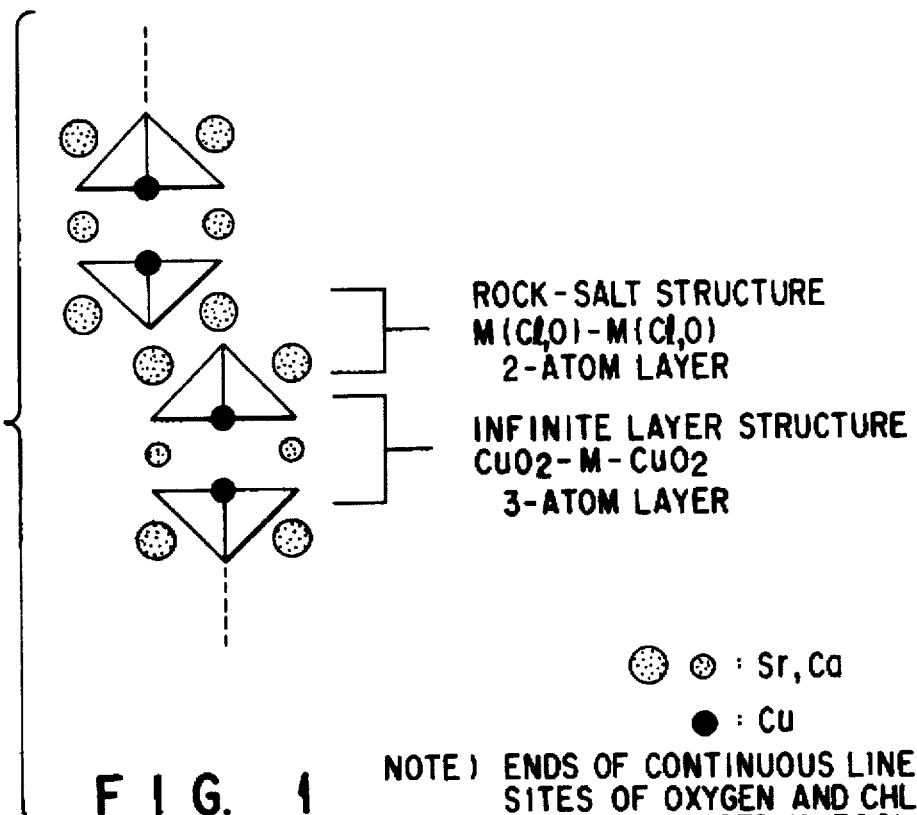
FIGS. 1 and 2 schematically show the crystalline structure of an oxide superconductor of the present invention.

In the oxide superconductor of the present invention, the portion based on the rock-salt structure consists of a structure in which two atom layers expressed as M(Cl, O)—M (Cl,O) are layered on each other. Note that at least one element is selected as the alkaline earth metal M, from Ba, Sr, and Ca.

In the oxide superconductor of the present invention, an infinite layer structure portion consists of a 2n−1 atomic layer containing a first atomic layer including oxygen atoms and copper atoms in ratio of 2:1 and a second atomic layer including only M atoms. Specifically, this structure is expressed as $CuO_2$—{M—$CuO_2$}$_{2n-2}$. In this composition, n is set to an integer of 1 or more. Especially, in case of an oxide superconductor including an infinite layer structure, n should preferably be set to an integer of 2 to 5, so that the oxide superconductor has a high Tc.

In addition, the present invention provides a method of manufacturing an oxide superconductor method characterized in that raw material of an oxide superconductor and material which releases oxygen in a heat treatment under a super high pressure are introduced into a high pressure container, and the raw material of the oxide superconductor and oxygen releasing material are subjected to a heat treatment of 800° to 1200° under a pressure of 2 to 8 GPa, thereby to obtain the oxide superconductor.

The method of manufacturing an oxide superconductor according to the present invention is characterized in that the raw material of the oxide superconductor is subjected to a heat treatment of 800° to 1200° C. under a super high pressure of 2 to 8 GPa.

The pressure during the heat treatment is set to 2 to 8 GPa. This is because, if the pressure during the heat treatment is lower than 2 GPa, the pressure is too low to obtain an oxide superconductor of the present invention. On the other side, if the pressure is higher than 8 GPa, a special pressure generation technique is required to generate a high pressure, and is not suitable for industrial practice, in view of the apparatus and costs. The temperature of the heat treatment is set to 800° to 1200° C. This is because, if the temperature is lower than 800° C., the temperature is too low to obtain an oxide superconductor. On the other side, if the temperature is higher than 1200° C., the temperature is so high that the raw material melts.

In the method of manufacturing an oxide superconductor according to the present invention, an oxygen releasing material is used in the heat treatment under a high pressure, in addition to raw material of the oxide superconductor. This is because a high oxygen partial pressure is required for the heat treatment. As the oxygen releasing material, at least one of $SrO_2$, $CaO_2$, $KClO_3$, $KClO_4$, $Ag_2O$, $Ag_2O_2$, and $CrO_3$ can be used.

In the following, embodiments of the present invention will be specifically explained.

Embodiment 1

In the first embodiment, an explanation will be made to an oxide superconductor having a composition of $Ca_2CuO_{2+\delta}Cl_2$ ($\delta$ is 0 to 0.8).

Raw material powders of CaO, $CaO_2$, CuO, $CuCl_2$, and $Ca_2CuO_3$ each having a purity of 99.9% were mixed at a mole ratio which satisfies the composition expressed as $Ca_2CuO_{2+\delta}Cl_2$, thereby to prepare five kinds of mixed powders which respectively had $\delta$ values of 0, 0.2, 0.4, 0.6, and 0.8 in the above-described composition. Pellets were formed with use of these kinds of the mixed powder. Note that $CaO_2$ serves not only as the raw material of Ca, but also as a so-called oxidization agent releases oxygen to raise the oxygen partial pressure in the container during a heat treatment.

In the next, each of the pellets was enclosed in a gold capsule and the gold capsule was sealed. This gold capsule was placed in a cubic anvil type high pressure generator apparatus, and was subjected to a heat treatment of one hour at a temperature of 950° C. Note that the heat treatment was carried out in a manner in which an NaCl layer was provided on the outside of each gold capsule, and each capsule was put in a graphite sleeve used as a heater, to which an electric current was supplied while applying a pressure thereto.

Thereafter, the gold capsules were taken out of the apparatus, and oxide superconductors were respectively taken out of the capsules.

The generated phase of each oxide superconductor was inspected by powder X-ray diffraction, to find that a crystal was generated which has the same crystalline structure as $Ca_2CuO_2Cl_2$ (non-superconductive phase) having a stable phase under a normal pressure. In addition, all of the oxide superconductors of 0.2, 0.4, and 0.6 had a single phase.

Further, each of the oxide superconductors was cooled in a magnetic field of 10Oe to investigate whether or not a Meissner effect appears. Then, a Meissner signal (Tc=18 to 26K) was confirmed in the oxide superconductors of $\delta$=0.2, 0.4, and 0.6.

It has thus been found that a superconductive phenomenon appears in the alkaline earth metal M-copper oxygen-chlorine based resultants, without doping cations such as sodium. However, the Meissner volume fraction was 6% at most ($\delta$=0.6) which is a signal strength somewhat insufficient for identification of a superconductive phase. In addition, Meissner signals were confirmed in oxide superconductors prepared by changing the pressure of the heat treatment to 2 GPa and 8 GPa.

Embodiment 2

In the embodiment 2, an explanation will be made to an oxide superconductor having a composition of $Ca_2CuO_{2+\delta}Cl_{2-y}$ ($\delta$ is 0 to 0.8, y is 0 to 1.6).

Like in the embodiment 1, oxide superconductors of single phase were prepared in which $\delta$ of the composition is 0, 0.2, 0.4, 0.6, and 0.8. With respect to these five kinds of oxide superconductors, the Meissner volume fractions at temperatures at 5K and Tc were investigated. The results are shown in the following table 1.

TABLE 1

| $\delta$ | Tc (K) | Meissner volume fraction (at 5K,%) |
|---|---|---|
| 0 | — | — |
| 0.2 | 17 | 28 |
| 0.4 | 20 | 40 |
| 0.6 | 26 | 46 |
| 0.8 | 26 | 42 |

The oxide superconductor having $\delta$ of 0.8 had a single phase and showed a high Meissner volume fraction. From this, it has been confirmed that a superconductive phenomenon appears in a crystalline phase having the same crystalline structure as $Ca_2CuO_2Cl_2$ having a stable phase under a normal pressure. In the above composition, since Cl is lower than 2.0 (especially y is 0.2 to 0.8), and the site of Cl in the $Ca_2CuO_2Cl_2$ is partially substituted by oxygen, it is considered that hole introduction due to the partial substitution causes a superconductive phenomenon. This can also be understood from the fact that the Meissner volume fraction was not raised when $\delta$ in the composition was increased where the Cl of the composition was set to 2.0. That is, the reason why the Meissner volume fraction was not increased is that if Cl in the composition is 2.0, the efficiency at which oxygen substitutes chlorine too low to obtain sufficient hole introduction.

Embodiment 3

In the embodiment 3, explanation will be made to an oxide superconductor having a composition expressed as $(Sr_{1-x}Ca_x)_3Cu_{2.2}O_{4+\delta}Cl_{2-y}$ ($\delta$ is 0 to 0.8, x is 0 to 0.8, and y is 0 to 1.6).

Raw material powders of CaO, $SrO_2$, CuO, $CuCl_2$, $Ca_2CuO_3$, and $SrCuO_2$ each having a purity of 99.9% were mixed at a mole ratio which satisfies a composition expressed as $Sr_{2.3}Ca_{0.7}Cu_{2.2}O_{4.4}Cl_{2-y}$, thereby to prepare ten kinds of mixed powders with y changed from 0 to 1.60 in the above-described composition. Pellets were formed with use of these ten mixed powders. These pellets were used to prepare oxide superconductors in the same manner as in the embodiment 1. With respect to ten kinds of oxide superconductors thus obtained, Meissner volume fractions at 5K and Tc were investigated. The results are shown in the following Table 2.

TABLE 2

| y | Tc (K) | Meissner volume fraction (at 5K,%) |
|---|---|---|
| 0 | — | — |
| 0.22 | 19 | 40 |
| 0.42 | 47 | 44 |
| 0.60 | 68 | 48 |
| 0.72 | 80 | 50 |
| 1.01 | 77 | 51 |
| 1.25 | 80 | 41 |
| 1.40 | 60 | 40 |
| 1.50 | 26 | 12 |
| 1.60 | 9 | 5 |

As can be seen from the Table 2, a Meissner volume fraction of 40% or more was attained by the oxide superconductors obtained where y was in the range of $0.22 \leq y \leq 1.40$.

Figure 3:
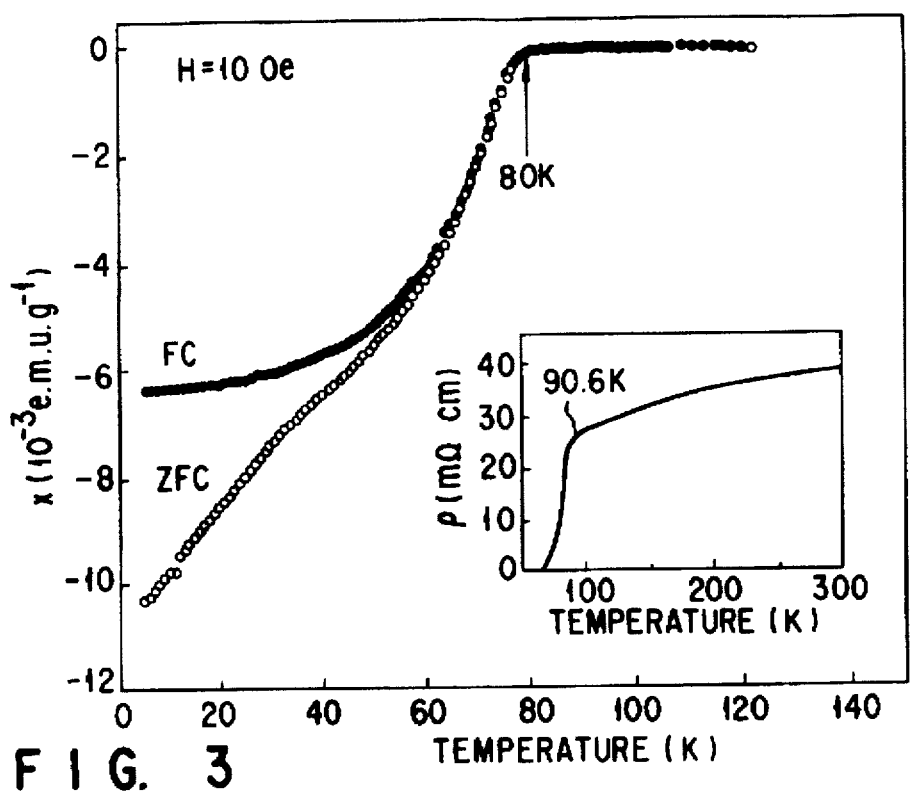
FIG. 3 are graphs respectively showing the relationship between the magnetization rate and the temperature, and the relationship (set in the former graph) between the electric resistance and the temperature.

In the next, with respect to the oxide superconductor having a composition of $Sr_{2.3}Ca_{0.7}Cu_{2.2}O_{4.4}Cl_{1.28}$, dependencies of its susceptibility rate ($\chi$) and electric resistance ($\rho$) on the temperature were investigated. The results are shown in FIG. 3. As can be seen from FIG. 3, Tc was up to 80K. The Meissner volume fraction was about 50% at 5K. Note that measurement of the magnetization rate was carried out in two modes, after the oxide superconductor was cooled to 4.2K in a zero magnetic field. One of the mode was zero magnetic field cooling (ZFC) in which the temperature was gradually increased while applying a magnetic field of 10Oe, and the other mode was magnetic field cooling (FC) in which the oxide superconductor is cooled in a magnetic field of 10Oe.

Figure 4:
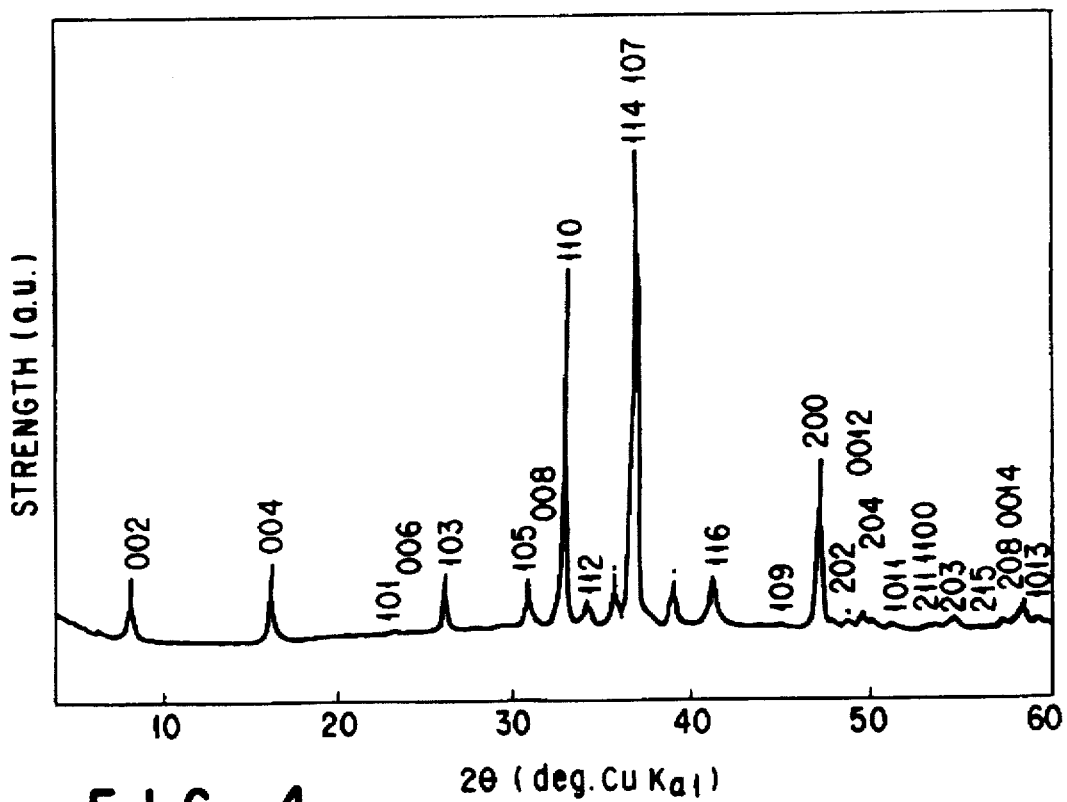
FIG. 4 shows an X-ray diffraction pattern showing the oxide superconductor of the present invention.

In the next, powder X-ray diffraction was carried out with respect to an oxide superconductor having y of 0.72 in the composition of $Sr_{2.3}Ca_{0.7}Cu_{2.2}O_{4.4}Cl_{2-y}$. The result is shown in FIG. 4. As can be seen from FIG. 4, an oxide superconductor having a substantially single phase was obtained. This is the same X-ray diffraction pattern as the $Ca_3Cu_2O_4Cl_2$ having a stable phase under a normal pressure. Note that from only CuO was detected as impurities from the X-ray diffraction pattern. This is because the composition preparation was arranged such that Cu was excessive by 0.2.

Thus, excessive Cu was applied on the following grounds. Specifically, in the characteristic evaluation of oxide superconductors, the characteristic evaluation is complicated if there exists a oxide superconductor phase other than the phase as a target, both mixed with each other. In those oxide superconductors which have the composition of this embodiment and do not contain excessive Cu, a phase mixed therein was confirmed which is an oxide superconductor phase having a composition of $(Sr, Ca)_2CuO_{2+\delta}Cl_{2-y}$ ($\delta$ is 0 to 0.8, y is 0 to 0.8). Therefore, in this embodiment, other oxide superconductor phases were prevented from being mixed by applying excessive Cu, in order that the characteristic could be easily carried out.

From the results, it has been confirmed that a crystalline phase having the same crystalline structure as $Ca_3Cu_2O_4Cl_2$ causes a superconductive phenomenon. In this case, it is considered the Cl site of $Ca_3Cu_2O_4Cl_2$ is partially substituted by oxygen, like in the embodiment 2, and hole introduction due to this partial substitution causes a superconductive phenomenon.

In the next, a rietveld analysis was carried out with respect to the powder X-ray diffraction pattern. The results are shown in the following Table 3.

TABLE 3

| Atom | Site | x | y | z | Occupation rate | Heat vibration factor (angstrom$^2$) |
|---|---|---|---|---|---|---|
| Sr/Ca(1) | 2a | 0 | 0 | 0 | 0.53/0.47(25) | 2.8/1.0 |
| Sr/Ca(2) | 4e | 0 | 0 | 0.1507(8) | 0.90/0.10(24) | 1.7/1.0 |
| Cu | 4e | 0 | 0 | 0.428(1) | 1.0 | 1.0 |
| O(1) | 8g | 0.5 | 0 | 0.428(1) | 1.0 | 2.9 |
| O(2) | 4e | 0 | 0 | 0.31(2) | 0.38(18) | 2.1 |
| Cl | 4e | 0 | 0 | 0.298(8) | 0.62(18) | 2.9 |

Space group: I4/mmm
Grid constant: a = 3.8679(2)angstrom, c = 22.161(1)angstrom
$R_{wp}$ = 5.69%, $R_p$ = 4.22%, $R_e$ = 2.78%, $R_i$ = 4.49%, $R_t$ = 3.19%

From the Table 3, it has been found that the oxide superconductor having the composition of $Sr_{2.3}Ca_{0.7}Cu_{2.2}O_{4.4}Cl_{1.28}$ has the crystalline structure as shown in FIG. 1. This crystalline structure is based on the crystalline structure of $La_2SrCu_2O_6$. Specifically, the crystalline structure of $Sr_{2.3}Ca_{0.7}Cu_{2.2}O_{4.4}Cl_{1.28}$ is a structure in which the rock-salt structure portion of the two-atom layer made of La—O in the crystalline structure of $La_2SrCu_2O_6$ is replaced with the rock-salt structure portion of the two-atom layer made of (Sr, Ca)—(Cl, O). However, Cl is considerably displaced from the site which should be expected from an ideal rock-salt structure, and the rock-salt structure of (Sr, Ca)—(Cl, O) is deformed in comparison with the rock-salt structure of La—O. Therefore, the oxide superconductor having a composition expressed as $(Sr_{1-x}Ca_x)_3Cu_{2.2}O_{4+\delta}Cl_{2-y}$ has a crystalline structure in which the deformed rock-salt structure portions of (Sr, Ca)—(Cl, O) and infinite layer structure portions of $CuO_2/(Sr, Ca)/CuO_2$ are alternately layered on each other.

Embodiment 4

Respective raw material powders were mixed so that Ca and Cu are increased, i.e., so that a composition of $Sr_{2.5}Ca_{1.5}Cu_{3.2}O_{6.4}Cl_{1.28}$ is satisfied, and thus, oxide superconductors were prepared. Powder X-ray diffraction was carried with respect to these oxide superconductors. As a result of this, it was found that the oxide superconductors had a crystalline phase of a periodic structure which is longer by 3.3 angstrom in the c-axis direction than the composition $(Sr_{1-x}Ca_x)_3Cu_{2.2}O_{4+\delta}Cl_{2-y}$ of the embodiment 3. In addition, the oxide superconductors were not of a single phase, but also included CuO and a phase mixed therein which has a periodic structure longer by 3.3 angstrom (i.e., 28.8 angstrom).

The crystalline phase including those long periodic structures is considered as being obtained in a manner in which a two-atom layer of (Sr, Ca)/CuO$_2$ or a four-atom layer of (Sr, Ca)/CuO$_2$/(Sr, Ca)/CuO$_2$ is inserted in a structure portion of an infinite layer having a composition expressed as $(Sr_{1-x}Ca_x)_3Cu_{2.2}O_{4+\delta}Cl_{2-y}$, and this crystalline phase was confirmed by observation with use of a transmission type electronic microscope.

In addition, the susceptibility was measured with respect to the oxide superconductors, like in the embodiment 1, and Meissner effects were confirmed. As a result of this, a superconductive transition occurred at 96K and 67K, and the Meissner volume fraction at 5K was 28%. From these results, it is found that a crystalline phase having a grid constant of 25.5 angstrom in the c-axis is an oxide superconductor whose infinite layer structure portion is made of a five-atom layer, while a crystalline phase having a grid constant of 28.8 angstrom in the c-axis is an oxide superconductor whose infinite layer structure portion is made of a seven-atom layer. The Tc of these oxide superconductors is considered as corresponding to 96K (five-atom layer) and 67K (seven-atom layer).

Figure 2:
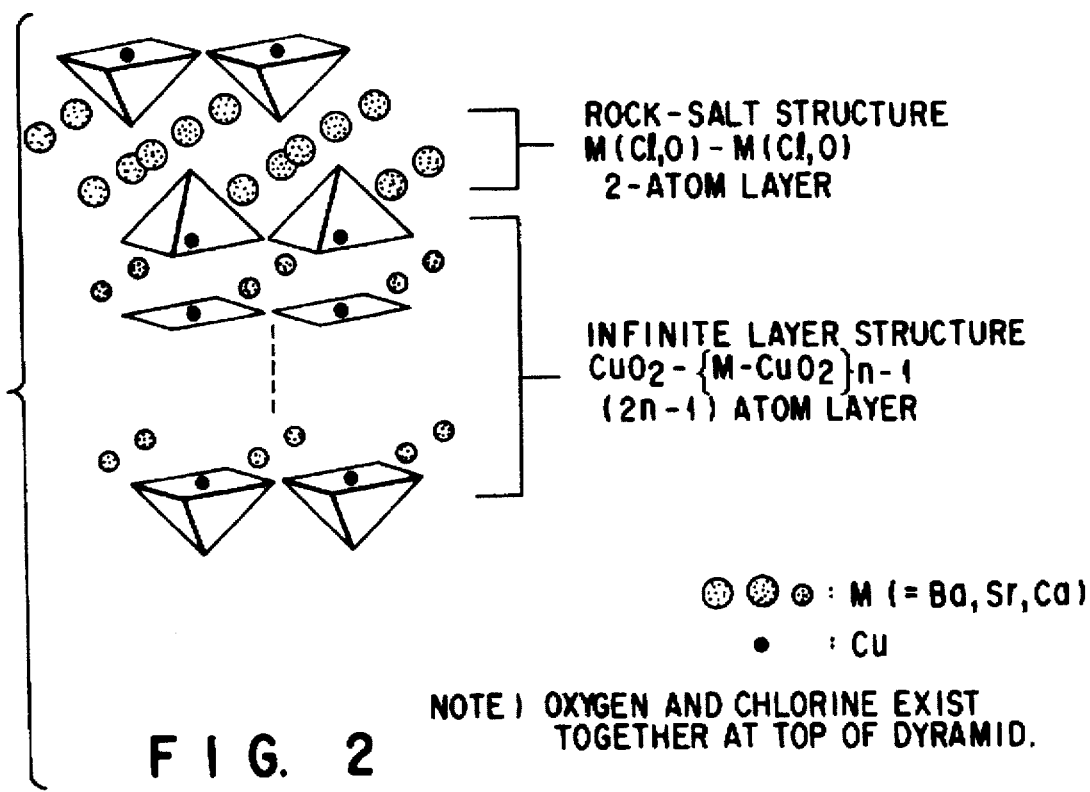

In addition, from observation using a transmission type electronic microscope, a portion of a much longer periodic structure was confirmed as being a layer defect. However, it is easily estimated that an oxide superconductor having a much longer infinite layer structure portion can be prepared by changing the raw material arrangement and manufacturing conditions (e.g., the pressure, temperature, and times). Thus, existence of oxide superconductors having the crystalline structure as shown in FIG. 2 is known.

Embodiment 5

Raw material powders of CaO, SrO$_2$, CuO, CuCl$_2$, Ca$_2$CuO$_3$, SrCuO$_2$, and BaCuO$_2$ each having a purity of 99.9% were mixed at a mole ratio which satisfies a composition expressed as $Sr_{2.3-z}Ba_zCa_{0.7}Cu_{2.2}O_{4.4}Cl_{1.28}$, thereby to prepare mixed powders with y changed from 0 to 1.0 in the above-described composition. Pellets were formed with use of these mixed powder. These pellets were used to prepare oxide superconductors in the same manner as in the embodiment 1. With respect to these oxide superconductors thus obtained, Tc was investigated. The oxide superconductors having z which satisfies a range of $0 \leq x \leq 0.6$ were of substantially single phase, and had a Tc of 70 to 80K. In the composition described above, those oxide superconductors which had z exceeding 0.6 resulted in deposition of BaCuO$_2$ and could not achieve a superconductive characteristic.

As has been explained above, the oxide super-conductors according to the present invention has a crystalline structure in which portions based on two rock-salt structures consisting of alkaline earth metal M, oxygen, and chlorine, and 2n−1 pieces of infinite layer structure portions are alternately layered on each other, wherein in the infinite layer structure portions, an atom layer including oxygen atoms and copper atoms in a ratio of 2 to 1 and an atom layer including only M atoms are layered on each other. Therefore, the oxide superconductors of the present invention do not contain elements such as Tl, Bi, and Hg which are very difficult to treat and poisonous, but are oxide superconductors of single phase which are stable in the air and have an excellent superconductive characteristic.

In addition, in the method of manufacturing oxide superconductors according to the present invention, raw material of oxide superconductors and material which releases oxygen during a heat treatment under a high pressure are introduced, and the raw material and the oxygen releasing material are subjected to a heat treatment at a temperature of 800° to 1200° C. under a super high pressure of 2 to 8 GPa. Therefore, oxide superconductors of single phase having an excellent superconductive characteristic as described above can be obtained with a high productivity.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An oxide superconductor consisting essentially of:
   (a) a rock-salt structure portion consisting essentially of two atomic layers, each of said two atomic layers including an alkaline earth metal, oxygen and chlorine, said rock-salt structure portion being of the formula M(Cl,O)—M(Cl,O), wherein M is the alkaline earth metal, and
   (b) an infinite layer structure portion containing (2n−1) atomic layers which are alternatively layered on each other, wherein n is an integer of 1 or more, said infinite layer structure portion being of the formula CuO$_2$—{M—CuO$_2$}$_{n-1}$, and consisting essentially of:
      (i) a first atomic layer including copper atoms and oxygen atoms in a ratio of 1 to 2 and
      (ii) when n is an integer of 2 or more, a second atomic layer including only alkaline earth metal M atoms, when n is 1, the second atomic layer is not present, wherein said oxide superconductor is free of sodium doping cations.

2. A method of manufacturing an oxide superconductor, comprising introducing raw material of an oxide superconductor and a material which releases oxygen into a high pressure container, and subjecting the raw material and the material releasing oxygen to a heat treatment at a temperature of 800° to 1200° C. under a super high pressure of 2 to 8 GPa, to obtain an oxide superconductor of claim 1.

3. An oxide superconductor of claim 1, wherein n is 2 to 5.

4. An oxide superconductor of claim 1, wherein n is 1.

5. A method according to claim 2, wherein said raw material consists essentially of powders of CaO, CaO$_2$, CuO, CuCl$_2$ and Ca$_2$CuO$_3$.

6. A method according to claim 2, wherein said raw material consists essentially of powders of CaO, SrO$_2$, CuO, CuCl$_2$, Ca$_2$CuO$_3$ and SrCuO$_2$.

7. A method according to claim 2, wherein said raw material consists essentially of powders of CaO, SrO$_2$, CuO, CuCl$_2$, Ca$_2$CuO$_3$, SrCuO$_2$ and BaCuO$_2$.

8. A method according to claim 2, wherein the material which releases oxygen is at least one material selected from the group consisting of SrO$_2$, CaO$_2$, KClO$_3$, KClO$_4$, Ag$_2$O, Ag$_2$O, and CrO3.

9. An oxide superconductor according to claim 1, wherein the alkaline earth metal M is at least one element selected from the group consisting of Ba, Sr, and Ca.

10. An oxide superconductor according to claim 1, wherein 3 to 9 layers of said infinite layer structure portion are contained.

11. An oxide superconductor according to claim 1, which defines a composition of $Ca_2CuO_{2+\delta}Cl_2$, where $\delta$ is greater than 0 to 0.8.

12. An oxide superconductor according to claim 1, which defines a composition of $Ca_2CuO_{2+\delta}Cl_{2-y}$, $\delta$ is greater than 0 to 0.8, and y is 0 to 1.6.

13. An oxide superconductor according to claim 1, which satisfies a composition of $(Sr_{1-x}Ca_x)_3Cu_{2.2}O_{4+\delta}Cl_{2-y}$, where $\delta$ is 0 to 0.8 x is 0 to 0.8, and y is 0 to 1.6.

14. An oxide superconductor according to claim 1, which defines a composition of $(Sr, Ca)_2CuO_{2+\delta}Cl_{2-y}$, where $\delta$ is greater than 0 to 0.8, and y is 0 to 1.6.

* * * * *